United States Patent
Smith

(10) Patent No.: US 6,963,216 B2
(45) Date of Patent: Nov. 8, 2005

(54) METHOD AND APPARATUS FOR DETECTING SHORTED RECTIFYING CONTROL ELEMENTS OF AN ENGINE DRIVEN POWER SOURCE FOR WELDING-TYPE SYSTEM

(75) Inventor: Alan F. Smith, Fremont, WI (US)

(73) Assignee: Illinois Tool Works Inc., Glenview, IL (US)

( * ) Notice: Subject to any disclaimer, the term of this patent is extended or adjusted under 35 U.S.C. 154(b) by 241 days.

(21) Appl. No.: 10/250,224

(22) Filed: Jun. 13, 2003

(65) Prior Publication Data

US 2004/0251910 A1 Dec. 16, 2004

(51) Int. Cl.[7] .......................... G01R 31/34; G01R 31/14; H02H 7/122; H02K 11/02
(52) U.S. Cl. .................... 324/772; 324/510; 363/56.03; 322/99
(58) Field of Search ................................ 324/510, 511, 324/771, 772, 767, 526; 363/89, 37, 52, 56.03, 56.04; 322/99

(56) References Cited

U.S. PATENT DOCUMENTS

| | | | | |
|---|---|---|---|---|
| 4,164,705 A | * | 8/1979 | Whitney et al. | 324/772 |
| 4,314,195 A | * | 2/1982 | Muter | 322/90 |
| 4,459,548 A | * | 7/1984 | Lentz et al. | 324/772 |
| 4,808,932 A | * | 2/1989 | Schulz et al. | 324/545 |
| 6,806,727 B2 | * | 10/2004 | Thibedeau et al. | 324/772 |
| 2002/0140433 A1 | * | 10/2002 | Lawson et al. | 324/509 |
| 2003/0080772 A1 | * | 5/2003 | Giacomini et al. | 324/771 |

* cited by examiner

Primary Examiner—Anjan K. Deb
(74) Attorney, Agent, or Firm—Ziolkowski Patent Solutions Group, SC

(57) ABSTRACT

An apparatus for electrical protection of an electrical system includes a protection circuit for detecting when silicon controlled rectifier (SCR) or other control elements in an engine driven generator of a welding-type power source have failed. In such an apparatus, a shorted rectifying control element detection device has an input stage connected to an engine driven generator that supplies power for a welding-type process and a filtering stage to bandpass current signals acquired by the input stage from the engine driven generator. The apparatus further has an output stage connected to the filtering stage that at least indicates a fault condition if fundamental frequency components present in the current signals exceed a threshold.

19 Claims, 4 Drawing Sheets

METHOD AND APPARATUS FOR DETECTING SHORTED RECTIFYING CONTROL ELEMENTS OF AN ENGINE DRIVEN POWER SOURCE FOR WELDING-TYPE SYSTEM

BACKGROUND OF INVENTION

The present invention relates generally to a protection circuit for electrical apparatuses, and more particularly, to a method and apparatus for detecting when silicon controlled rectifier (SCR) control elements or other rectifying control elements in an engine driven generator of a welding-type power source have failed.

SCRs are known in the power electronics industry for their use as high power current switching devices. Such devices have found wide application in solid-state control systems where it is desired to control the voltage, current, and/or power supplied to a load. Generally, in single phase or poly-phase systems, one or more pairs of SCRs can be connected in a back-to-back relationship and in series with a load. The SCRs are further connected to an alternating current (AC) supply source, from which the current, voltage, or power desired to be controlled is provided. Typically, SCRs are triggered into conduction at an appropriate time in the positive and negative half cycles of the AC supply. The time between the zero crossing of the AC supply waveform and the moment at which the SCRs are driven into conduction is commonly referred to as the firing angle of the SCR. Adjusting the firing angle provides a means for controlling the voltage, current, and/or power delivered to the load.

Power sources for welding-type systems commonly use an SCR bridge, transistors, or diodes to control the welding-type output current using conventional phase control techniques. For static welding-type machines such as those that are powered by utility line supplies, shorted SCR detection circuits monitor the input voltage to the SCR bridge. If a short is present in the system the input voltage to the SCR bridge will go to zero. Because the short is applied through a failed device within an output rectifier bridge, the short is applied for only one-half of an AC cycle. Moreover, since machines powered by a utility line source will always have an input voltage to the SCR bridge under no-fault conditions, detection of a zero voltage at the input of the SCR bridge is indicative of a fault present in the system.

In contrast, engine driven generators will routinely have a zero voltage input to the SCR bridge during normal operation. For example, when the SCR bridge is turned on, the input voltage will be zero as a result of the high impedance of the generator. Further, the voltage may often collapse to zero when large currents are drawn from the generator. Because periods of zero voltages are not harmful and are expected in normal operation of an engine driven generator, detection circuits monitoring input voltage to the SCR bridge cannot discern between normal zero-going voltages or fault induced zero-going voltages. Therefore, electrical circuits that monitor input voltages are inapplicable with high impedance power sources such as engine driven generators.

Because voltage monitoring is not preferred for engine driven power sources, a number of systems have been developed that focus on input current to the SCR bridge to detect and determine shorted or fault conditions in the SCR. For example, fuses have commonly been used in each of the three-phase AC lines to detect high current flow. Another approach uses current transformers placed in each AC line to detect high current. While both of these approaches will indicate a shorted SCR bridge of an engine driven power source, these approaches require expensive and bulky external hardware that significantly increase the size, weight, and cost of the power source.

It would therefore be desirable to design an electrical circuit configured to detect shorted conditions of rectifying control elements in an engine driven generator of a welding-type power source.

BRIEF DESCRIPTION OF INVENTION

The present invention is directed to an electrical circuit designed to detect shorted conditions in rectifying control elements of an engine driven generator of a welding-type power source that overcomes the aforementioned problems. The electrical circuit includes a bandpass filter to pass only those frequency components of a current signal indicative of current in the rotor of an engine driven generator that are indicative of shorted conditions. By monitoring the generator field current for specific frequency components a fault condition can be determined. The specific frequency components are induced by a DC component in the stator of generator which can only occur under a fault condition. The bandpass filter includes a high pass filter and a low pass filter that collectively allow frequency components ranging from idle to rated speed of the generator to be passed. By analyzing the frequency components that are passed by the bandpass filter, a fault condition can be determined. Moreover, if the fundamental frequency components exceed corresponding thresholds, the engine driven generator may be automatically disabled.

Therefore, in accordance with one aspect of the present invention, a shorted rectifying control element detection device includes an input stage connected to an engine driven generator to supply power for a welding-type process. The detection device includes a filtering stage to bandpass current signals acquired by the input stage as well as an output stage connected to the filtering stage and configured to at least indicate a fault condition if fundamental frequency components present in the current signals exceed a threshold.

In accordance with another aspect of the present invention, an engine driven welding-type system includes a synchronous wound field generator having a rotor magnetically coupled to a stator as well as an SCR bridge connected to be supplied with power from the generator and continue to rectify the power into a form usable in a welding-type process. The welding-type system further includes a fault detection circuit designed to determine if stator induced fundamental frequency components are present in current flowing through the rotor as well as a fault indicator connected to the fault detection circuit and configured to output a fault present signal.

According to another aspect of the present invention, a short circuit detection device for an engine driven generator includes means for detecting current in a rotor of a generator as well as means for isolating frequency components with current indicative of a stator induced DC component. The short circuit detection device further includes means for determining a short from the isolated frequency components.

In accordance with another further aspect of the present invention, a method of detecting a shorted SCR of an engine driven welding-type power source includes the step of detecting current in a rotor of an engine driven generator as well as the step of isolating frequency components in the current indicative of a stator induced DC The method also includes the step of determining if the shorted SCR condition is present from the isolated frequency components.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

The present invention will be described with respect to an engine driven power source for a MIG or Gas Metal Arc Welding (GMAW) system.

One skilled in the art will appreciate however, that the present invention is applicable with power sources for other types of welding systems such as stick welding and TIG welding systems as well as other high output welding-type systems such as induction heaters and plasma cutters.

Figure 1:
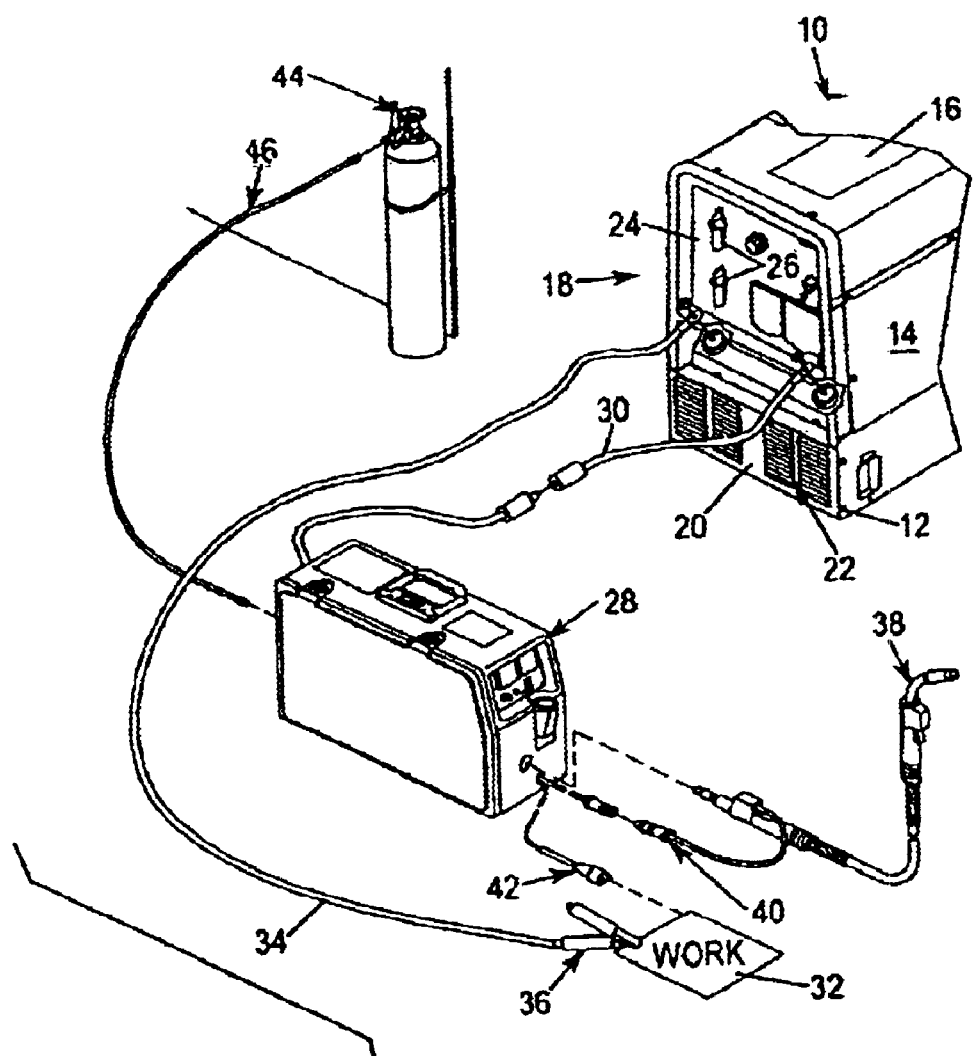
FIG. 1 is a perspective view of an engine driven power source connected to a wire feeder assembly of an MIG welding system.

Referring now to FIG. 1, an engine driven power source 10 houses an internal combustion engine (not shown) designed to supply raw power that when conditioned is usable for a welding-type process. The power source 10 also includes a base 12, sidewalls 14, and a top cover 16 that connects the base and sidewalls into a single integrated unit. End 18 has an end cover 20 containing louvers 22. The louvers 22 allow airflow into the power source 10 to cool internal components during device operation. Control panel 24 includes controls 26 that can be used by an operator to select a desired welding current amperage value and other operational parameters for a welding-type process.

For MIG welding applications, power source 10 is connected to a wire feeder 28 via control cable 30 and is connected to a work piece 32 via negative weld cable 34. A clamp 36 is connected to an end of negative weld cable 34 and is designed to hold and present work piece 32 to a weld. Wire feeder 28 is designed to present a consumable wire electrode to the weld via a MIG gun or torch 38. Gun 38 is connected to the wire feeder via a connecting plug 40. In some applications, the wire feeder may be a volt sensed wire feeder and, as such, includes a voltage sensing clamp 42 that is secured to work piece 32 during welding. For MIG welding applications a gas cylinder 44 provides shielding gas to the wire feeder for use during the welding process through gas hose 46.

Figure 2:
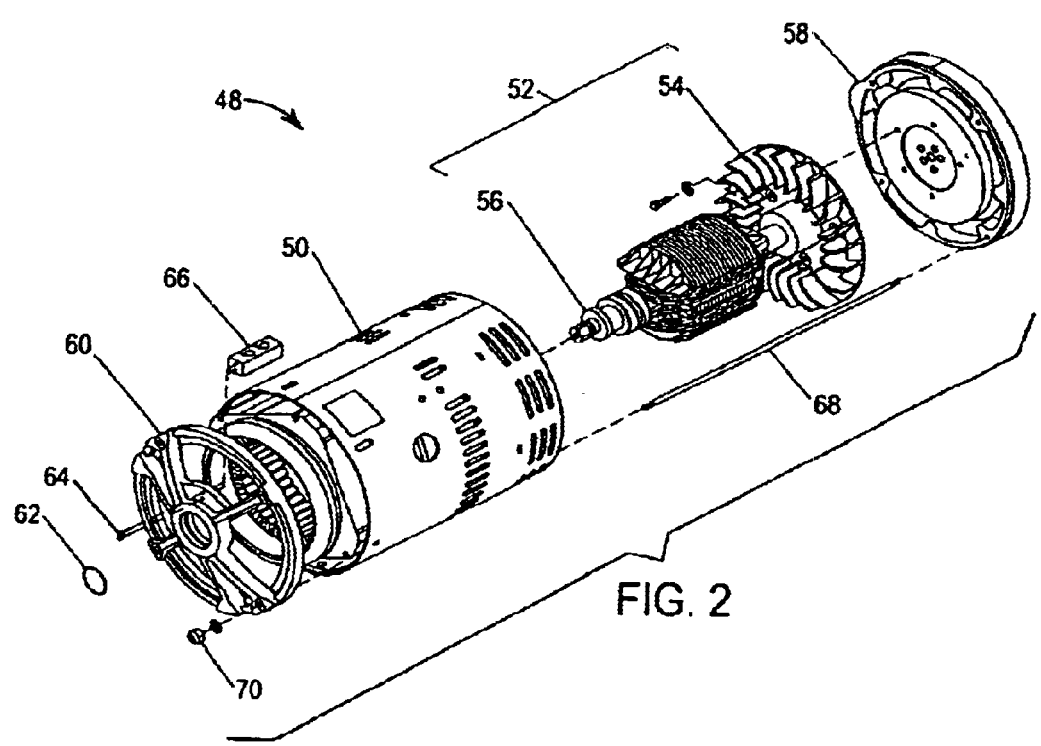
FIG. 2 is an exploded view of an engine driven generator for use with the power source illustrated in FIG. 1.

Referring now to FIG. 2, an exploded view of a generator for use with the power source illustrated in FIG. 1 is shown. The generator 48 includes a stator 50 and rotor assembly 52. The rotor assembly 52 includes a fan 54 and a ball bearing assembly 56. Rotor assembly 52 is designed to be positioned within stator 50 and secured thereto by adapter plate 58. Adapter plate 58 is designed to secure the generator 48 to an engine (not shown). Connected to an opposite end of stator 50 is an endbell 60 that includes an o-ring 62 and a pair of fasteners 64 for securing a brushholder assembly 66 thereto. Elongated stud 68 extends from the endbell 60 within stator 58 to adapter plate 58. The elongated stud 68 is secured to endbell 60 via washer and nut assembly 70.

Generator 48 is used to supply power to an SCR bridge in the power source. Preferably, generator 48 is a synchronous wound field generator. In this regard, stator 50 includes stator windings that when supplied with current will induce currents in windings of the rotor assembly 52. Typically, DC current is supplied to the rotor assembly to produce output power in the stator. Under normal three-phase loading of the stator, currents are not induced in the rotor assembly. However, a single-phase load supplied to the stator or windings will induce a 120 Hz current in the rotor assembly. In a shorted SCR condition, a half-wave short is applied to the generator due to the nature of the SCR bridge. Current flow for one-half of the AC cycle has a DC component that is half wave rectified. The DC component flowing in the stator will induce fundamental frequency currents in the rotor assembly. For a 60 Hz machine, the rotor currents will also be 60 Hz. When the machine is operating at other than rated speed such as at idle, the frequency is reduced in the same proportion as the engine speed. As will be described in greater detail below, these fundamental frequency components can only be caused by a DC component in the stator. Sustained DC components in the stator can only occur under fault conditions. Therefore, by monitoring the generator field current for specific frequency components a fault condition can be determined.

Figure 3:
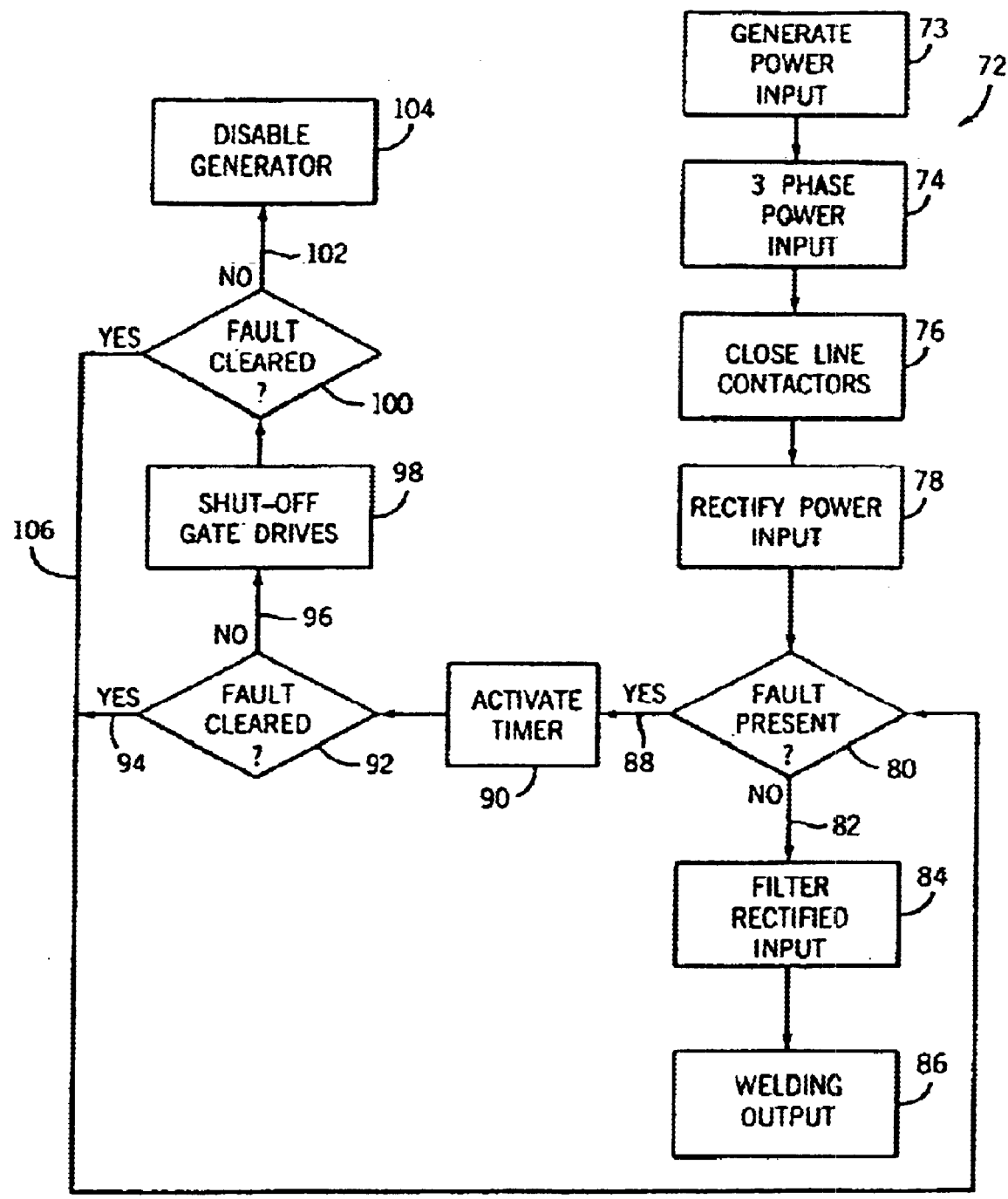
FIG. 3 is a flow chart illustrating the steps of a control algorithm to regulate a power supply system in accordance with one embodiment of the present invention.

FIG. 3 is a flow chart illustrating the steps of a control algorithm 72 to regulate a power supply system. An engine driven generator provides a three-phase power supply input 74 that is passed to a rectifying circuit 78 such as an SCR bridge. In one example, the SCR bridge 78 includes pairs of SCRs connected in a back-to-back relationship. The SCRs can comprise any silicon-controlled element capable of regulating electric current flow. A fault detector circuit monitors the components of the rectifying circuit to determine the onset of fault conditions, i.e. a shorted rectifying component, at step 80. If the rectifying circuit components are operating properly and as such fault conditions are not present 80, 82, the rectified input is passed to a filter circuit for filtering at 84. The filter circuit is configured to filter any undesired frequency components from the electrical current, which is then made available as welder output 86 to perform welding operations at voltages and currents determined by operator settings of controls 26.

However, if a fault condition exists 80, 88, for example, if one or more of the SCRs is shorted a timer is activated at 90. Timer 86 counts up from a start value to an end value. The timer is activated so that a determination can be made as to whether a real fault condition resides in the system or if the short was caused by a transient or noise condition. Accordingly, a determination is made at step 92 as to whether the fault has cleared. If so 92, 94, the detector circuit returns to step 80 for further monitoring of the components of the rectifying circuit components. If the fault condition persists and therefore has not cleared 92, 96, the timer will reach the end value thereby signaling to a control unit that the gate drives to the rectifying components should be shut off at 98. If the short persists after the gate drives have been shut off 98, 100, 102, the generator is then caused to be shut down 104. If shutting off of the gate drives to the rectifying components clears the faults, the generator is allowed to continue operating and producing auxiliary power.

Figure 4:
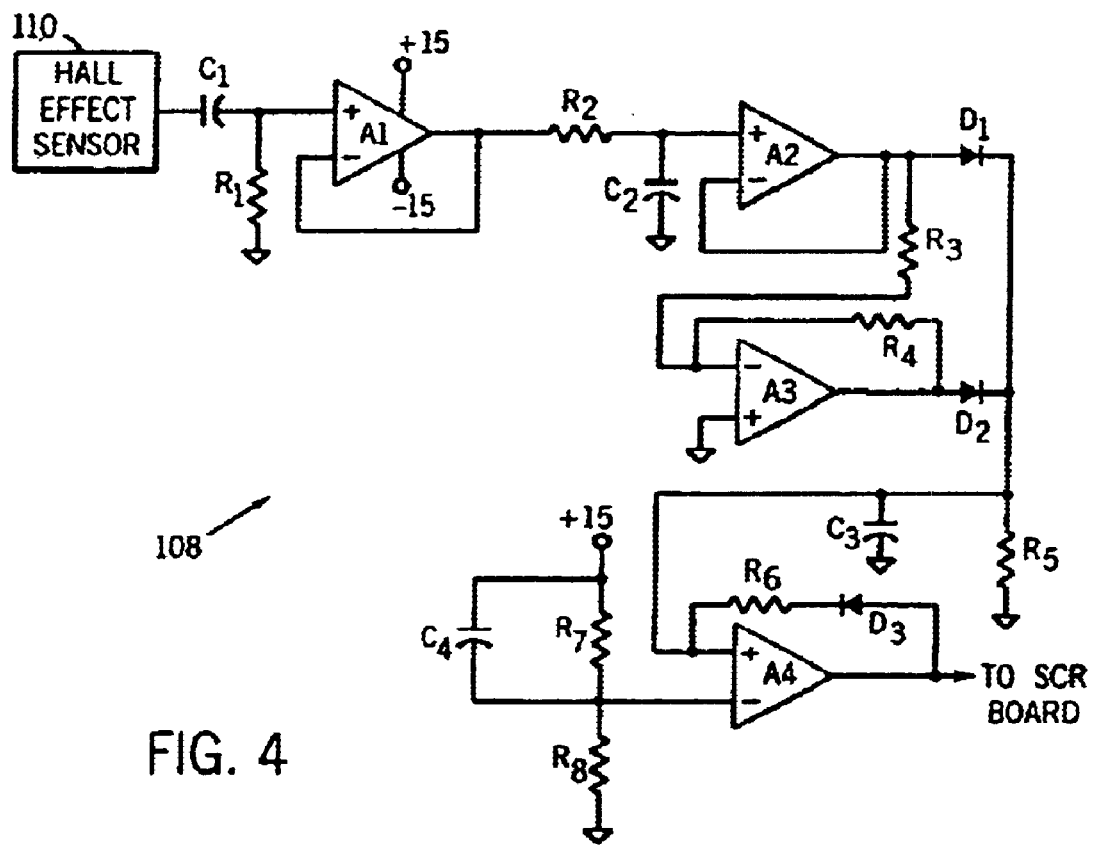
FIG. 4 is a circuit diagram of a bandpass filter to detect a shorted SCR in accordance with the present invention.

Referring now to FIG. 4, an example of operational circuitry to implement a shorted SCR detector circuit in accordance with the current invention is shown. One skilled in the art will fully recognize, however, that alternatives and variations to the circuitry specifically illustrated are possible, contemplated, and within the scope of the invention. Additionally, the illustrated circuitry is applicable with detecting shorts in other types of rectifying components such as transistors and diodes. Circuit 108 is designed to bandpass current signals provided by a Hall effect sensor and, based on an analysis of the current feedback, determined if a short or otherwise fault condition is present.

Field current feedback from the rotor in the engine driven generator is provided by a Hall effect sensor 110. The current signals are then bandpass filtered to pass only those frequency components that would occur under a fault condition. Specifically, a high pass filter, amplifier A1, cascading with a low pass filter amplifier, A2, bandpass the current feedback signal. The passed result includes frequency components in the range of 36 to 80 Hz being passed through. This particular range of 36 to 80 Hz illustrates one example of the fundamental frequency range of a generator at idle to a generator at its maximum rated speed. As such, the frequency range that is bandpassed will depend upon the frequency of the generator at idle as well as the frequency of the generator at its maximum rated speed. The high pass filter A1 is designed to reject the normal operation DC component found in the current signal. The low pass filter A2 is designed to reject the 120 Hz component that occurs under a normal single-phase load, i.e. auxiliary power. The bandpass signal is then rectified, by amplifier A3 and two associated diodes D1, D2. The rectified signal is then passed to comparator A4 which detects excessive fundamental frequency components and transmits a signal to the microprocessor to shut off the gate drive to all SCRs. The circuit is latched by software. As such, the power source must be shut down to deactivate the latch. It is understood that a buffer amplifier (not shown) may by used to buffer the rectified signal before its fed to the comparator A4.

Circuit 108 is designed to compare isolated fundamental frequency components in the current signal to a threshold value to determine if the fundamental frequency components are at a level that warrants shutdown of the SCRs. Accordingly, circuit 108 may be constructed to provide various audio and visual warnings and/or indicators upon detection of fault conditions being present in the system, i.e., frequency components present.

As one skilled in the art will fully appreciate, the heretofore description of welding devices not only includes welders, but also includes any system that requires high power outputs, such as heating and cutting systems . Therefore, the present invention is equivalently applicable with any device requiring high power output, including welders, plasma cutters, induction heaters, and the like. Reference to welding power, welding-type power, or welders generally, includes welding, cutting, or heating power. Description of a welding apparatus illustrates just one embodiment in which the present invention may be implemented. The present invention is equivalently applicable with many high power systems, such as cutting and induction heating systems, or any similar systems.

Therefore, in accordance with one embodiment of the present invention, a shorted SCR detection device includes an input stage connected to an engine driven generator to supply power for a welding-type process. The detection device includes a filtering stage to bandpass current signals acquired by the input stage by as well as an output stage connected to the filtering stage and configured to at least indicate a fault condition if fundamental frequency components present in the current signals exceed a threshold.

In accordance with another embodiment of the present invention, an engine driven welding-type system includes a synchronous wound field generator having a rotor magnetically coupled to a stator as well as an SCR bridge connected to be supplied with power from the generator and continue to rectify the power into a form usable in a welding-type process. The welding-type system further includes a fault detection circuit designed to determine if stator induced fundamental frequency components are present in current flowing through the rotor as well as a fault indicator connected to the fault detection circuit and configured to output a fault present signal.

According to another embodiment of the present invention. A short circuit detection device for an engine driven generator includes means for detecting current in a rotor of a generator as well as means for isolating frequency components with current indicative of our stator induced DC component. The short circuit detection device further includes means for determining a short from the isolated frequency components.

In accordance with another further embodiment of the present invention, a method of detecting a shorted SCR of an engine driven welding-type power source includes the step of detecting current in a rotor of an engine driven generator as well as the step of isolating frequency components in the current indicative of a stator induced DC component. The method also includes the step of determining if the shorted SCR condition is present from the isolated frequency components.

The present invention has been described in terms of the preferred embodiment, and it is recognized that equivalents, alternatives, and modifications, aside from those expressly stated, are possible and within the scope of the appending claims.

What is claimed is:

1. A shorted rectifying control element detection device comprising:
   an input stage connected to an engine driven generator configured to supply power for a welding-type process;
   a filtering stage to bandpass current signals acquired by the input stage from the engine driven generator; and
   an output stage connected to the filtering stage and configured to at least indicate a fault condition if fundamental frequency components present in the current signals exceed a threshold.

2. The device of claim 1, wherein the output stage is further configured to disable the generator if the fundamental frequency components exceed the threshold.

3. The device of claim 1 wherein the input stage is configured to acquire the current signals from current induced in a rotor of the generator.

4. The device of claim 3 wherein the input stage includes a Hall effect sensor.

5. The device of claim 1 wherein the filtering stage includes a bandpass filter to pass only those fundamental frequency components that would occur under the fault condition.

6. The device of claim 5 wherein the fault condition includes a shorted SCR circuit.

7. The device of claim 6 wherein the shorted SCR causes a DC current component to flow through a stator of the generator which manifests as fundamental frequency components in current flowing through a rotor of the generator.

8. The device of claim 5 wherein the bandpass filter is configured to low pass and high pass filter the current signals to isolate those fundamental frequency components associated with the fault condition.

9. The device of claim 1 wherein the generator includes a synchronous wound field generator and wherein current flowing in stator windings induces currents in rotor windings.

10. An engine driven welding-type system comprising:
   a synchronous wound field generator having a rotor magnetically coupled to a stator;
   an SCR bridge connected to be supplied with power from the generator and configured to rectify the power into a form usable in a welding-type process;
   a fault detection circuit designed to determine if stator induced fundamental frequency components are present in current flowing through the rotor; and
   a fault indicator connected to the fault detection circuit and configured to output a fault present signal.

11. The engine driven welding-type system of claim 10 wherein the fault detector circuit includes:
   a Hall effect sensor connected to detect current in the rotor;
   a bandpass filter to isolate those frequency components in the current flowing through the rotor that are indicative of a fault condition; and
   a comparator to compare the isolated frequency components to a base value to determine if an unacceptable fault condition is present.

12. The engine driven welding-type system of claim 11 wherein the fault indicator is further configured to disable the generator if an unacceptable fault is present.

13. The engine driven welding-type system of claim 11 wherein the bandpass filter includes a low pass filter and a high pass filter.

14. The engine driven welding-type system of claim 13 wherein the bandpass filter is further configured to pass frequency components in a range that includes idle frequencies and rated speed frequencies.

15. The engine driven welding-type system of claim 14 wherein the bandpass filter is further configured to pass frequency components in a rang of about 36 Hz to 80 Hz.

16. A short circuit detection device for an engine driven generator, the detection device comprising:
   means for detecting current in a rotor of a generator;
   means for low pass filtering and means for high pass filtering the current, the means for low pass filtering includes means for rejecting 120 Hz component that occurs under a single phase load and the means for high pass filtering includes means for rejecting normal operation DC components present in the current;
   means for isolating frequency components in the current indicative of a stator induced DC component; and
   means for determining a short from the isolated frequency components.

17. The short circuit detection device of claim 16 further comprising means for automatically disabling the generator.

18. The short circuit detection device of claim 16 further comprising means for isolating only those frequency components that would occur in response to a stator induced DC component in the rotor current.

19. A method of detecting a shorted SCR of an engine driven welding-type power source comprising the steps of:
   detecting current in a rotor of an engine driven generator configured to supply power for a welding-type process;
   isolating frequency components in the current indicative of a stator induced DC component; and
   determining if a shorted SCR condition is present from the isolated frequency components.

* * * * *

UNITED STATES PATENT AND TRADEMARK OFFICE
CERTIFICATE OF CORRECTION

PATENT NO. : 6,963,216 B2
DATED : November 8, 2005
INVENTOR(S) : Smith

It is certified that error appears in the above-identified patent and that said Letters Patent is hereby corrected as shown below:

Column 3,
Line 1, insert -- component. -- after "DC".

Signed and Sealed this

Thirty-first Day of January, 2006

JON W. DUDAS
*Director of the United States Patent and Trademark Office*